United States Patent
Tsai et al.

(10) Patent No.: US 7,037,750 B2
(45) Date of Patent: May 2, 2006

(54) METHOD FOR MANUFACTURING A PACKAGE

(75) Inventors: Yu-Fang Tsai, Kaohsiung (TW); Chin-Hsien Lin, Kaohsiung (TW); Tsung-Yueh Tsai, Kaohsiung (TW)

(73) Assignee: Advanced Semiconductor Engineering Inc., Kaoshiung (TW)

( * ) Notice: Subject to any disclaimer, the term of this patent is extended or adjusted under 35 U.S.C. 154(b) by 164 days.

(21) Appl. No.: 10/776,490

(22) Filed: Feb. 11, 2004

(65) Prior Publication Data
US 2004/0161879 A1 Aug. 19, 2004

(30) Foreign Application Priority Data
Feb. 19, 2003 (TW) ............... 92103468 A

(51) Int. Cl.
*H01L 21/44* (2006.01)
*H01L 21/48* (2006.01)
*H01L 21/50* (2006.01)

(52) U.S. Cl. ............ 438/106; 438/117; 438/118; 438/613; 438/612; 438/125

(58) Field of Classification Search ............ 438/106, 438/108, 123, 125
See application file for complete search history.

(56) References Cited

U.S. PATENT DOCUMENTS 6,762,078 B1 * 7/2004 Shin et al. ............... 438/123
6,781,242 B1 * 8/2004 Fan et al. ............... 257/777

* cited by examiner

Primary Examiner—Chuong Anh Luu
(74) Attorney, Agent, or Firm—Thomas, Kayden, Horstemeyer & Risley

(57) ABSTRACT

A method of manufacturing a package is disclosed. The manufacturing method includes the steps of providing a substrate having an opening, disposing a metal slice on a bottom surface of the substrate to cover the opening and bond pads on the bottom surface of the substrate, disposing a die on the metal slice inside the opening or above the top surface of the substrate outside the opening, forming a number of bond wires between the top surface of the die and the top surface of the substrate to electrically connect the die to the substrate, forming an encapsulating mold compound to cover the die, the bond wires, and a part of the top surface of the substrate, removing a part of the metal slice to form a metal heat slug thermally connected to the die and to expose the bond pads, and forming a number of solder balls on the exposed bond pads.

11 Claims, 7 Drawing Sheets

METHOD FOR MANUFACTURING A PACKAGE

This application claims the benefit of Taiwan application Serial No. 92103468, filed Feb. 19, 2003.

BACKGROUND OF THE INVENTION

1. Field of the Invention

The invention relates to a method of manufacturing a package, and more particularly to a package, in which a metal heat slug is disposed below a bottom surface of a die, and a manufacturing method thereof.

2. Description of the Related Art

Since the electrical products are gradually miniaturized, the packages for protecting semiconductor dies and providing connections to external circuits also have to be miniaturized. Of course, the heat dissipation designs for the packages are also important considerations.

FIG. 1 is a cross-sectional view showing a conventional package having a metal heat slug ball grid array (HSBGA). Referring to FIG. 1, the package 100 includes a substrate 102, adhesive agents 104a and 104b, a die 106, a number of bond wires 108, a metal heat slug 110, an encapsulating mold compound 112, a number of bond pads 114, and a number of solder balls 116. The die 106 is disposed on the top surface of the substrate 102 through the adhesive agent 104a by way of die attaching. In addition, the bond wires 108 are formed, by way of wire bonding, between the top surface of the die 106 and the top surface of the substrate 102 outside the die 106 to electrically connect the die 106 to the substrate 102. Two pendent ends of the metal heat slug 110 are disposed on the top surface of the substrate 102 outside the bond wires 108 through the adhesive agent 104b. Thus, the middle, horizontal structure of the metal heat slug 110 is located above the top surface of the die 106. In addition, the encapsulating mold compound 112 covers a part of the metal heat slug 110, the die 106, the bond wires 108, and a part of the top surface of the substrate 102 with the middle, horizontal structure exposed out of the metal heat slug 110 by way of encapsulating. Furthermore, the bond pads 114 are formed on the bottom surface of the substrate 102 and are electrically connected to the bond wires 108 through internal traces of the substrate 102. A number of solder balls 116 flush with each other are formed on the bond pads 114 by way of ball mounting, and the package 100 is electrically connected to external circuits through the solder balls 116. It is to be noted that the thickness of the package 100 is defined as a distance from the bottom end of the solder ball 116 to the top end of the encapsulating mold compound 112.

When the package 100 is operating, the heat from the die 106 may be dissipated to the outside via the metal heat slug 110. However, because the thermal conductivity of the substrate 102 is not so good and a solder mask with low thermal conductivity is formed on the top surface of the substrate, the heat generated by the die 106 is blocked by the solder mask and is accumulated between the die 106 and the top surface of the substrate 102 and thus cannot be easily dissipated, thereby greatly influencing the operation of the package 100. In addition, the design of disposing the metal heat slug 110 above the top surface of the die 106 may increase the thickness of the package 100. On the other hand, based on the consideration of the arrangement of the bond wires, the pendent ends of the metal heat slug 110 have to be disposed on the top surface of the substrate 102 outside the bond wires 108, and the area of the top surface of the substrate 102 has to be enlarged accordingly. Consequently, the overall volume of the package 100 will be enlarged, and the manufacturing cost will be increased.

SUMMARY OF THE INVENTION

In view of this, an objective of the invention is to provide a package and manufacturing method thereof. The design of disposing a metal heat slug below the bottom surface of the die enables the heat of the die to be dissipated to the outside through the metal heat slug, which is below the bottom surface of the die and has high thermal conductivity. Thus, the problems caused by the low thermal conductivity of the substrate may be avoided, and the heat dissipating effects of the package may be improved. In addition, because the thickness of the metal heat slug is smaller than the height of the solder ball, the overall thickness of the package is greatly reduced.

The invention achieves the above-identified object by providing a package including a substrate, a metal heat slug, a die, a number of bond wires, an encapsulating mold compound, and a number of solder balls. The metal heat slug is disposed on the bottom surface of the substrate to cover a bottom of the opening of the substrate. The die is disposed on the metal heat slug inside the opening or above the top surface of the substrate outside the opening and is thermally connected to the metal heat slug. The bond wires are formed between the top surface of the die and the top surface of the substrate to electrically connect the die to the substrate. The encapsulating mold compound covers the die, the bond wires, and a part of the top surface of the substrate. The solder balls are formed on the bond pads on the bottom surface of the substrate, respectively.

When the bottom area of the die is smaller than the dimension of the opening, the die is disposed on the metal heat slug inside the opening by an adhesive agent, and a gap between the die and a sidewall of the opening is filled with another adhesive agent or the encapsulating mold compound. When the bottom area of the die is equal to the dimension of the opening, the die is disposed on the metal heat slug inside the opening by an adhesive agent. When the bottom area of the die is greater than the dimension of the opening, the die is disposed above the top surface of the substrate outside the opening by an adhesive agent, and the opening between the die and the metal heat slug is filled with the adhesive agent. Thus, the die may be thermally connected to the metal heat slug by the adhesive agent.

The invention also achieves the above-identified object by providing a method for manufacturing a package. The method includes the steps of: providing a substrate having an opening and a bottom surface formed with a number of bond pads; disposing a metal slice on the bottom surface of the substrate to cover the opening and the bond pads on the bottom surface of the substrate; disposing a die on the metal slice inside the opening or above the top surface of the substrate outside the opening; forming a number of bond wires between the top surface of the die and the top surface of the substrate to electrically connect the die to the substrate; forming an encapsulating mold compound to cover the die, the bond wires, and a part of the top surface of the substrate; removing a part of the metal slice to form a metal heat slug thermally connected to the die and to expose the bond pads; and forming a number of solder balls on the bond pads.

The method may use an adhesive agent to dispose a die, which has a bottom area smaller than the dimension of the opening, on the metal slice inside the opening, and use another adhesive agent or encapsulating mold compound to fill into a gap between the die and a sidewall of the opening. The method also may use an adhesive agent to disposing a die, which has a bottom area equal to the dimension of the opening, on the metal slice inside the opening. Alternatively, the method also may use an adhesive agent to dispose a die, which has a bottom area greater than the dimension of the opening, above the top surface of the substrate outside the opening, and to fill the adhesive agent into the opening between the die and the metal slice. Then, the die may be thermally connected to the metal heat slug by the adhesive agent.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention particularly designs a package and the manufacturing method thereof. The design of disposing a metal heat slug below the bottom surface of the die enables the heat of the die to be dissipated out of the package through the metal heat slug, which has high thermal conductivity. Thus, the blocking effects for the solder mask of the substrate having low thermal conductivity may be avoided, and the heat dissipating effects of the package could be improved. In addition, because the thickness of the metal heat slug is smaller than the height of the solder ball, the overall thickness of the package is greatly reduced.

Figure 1:
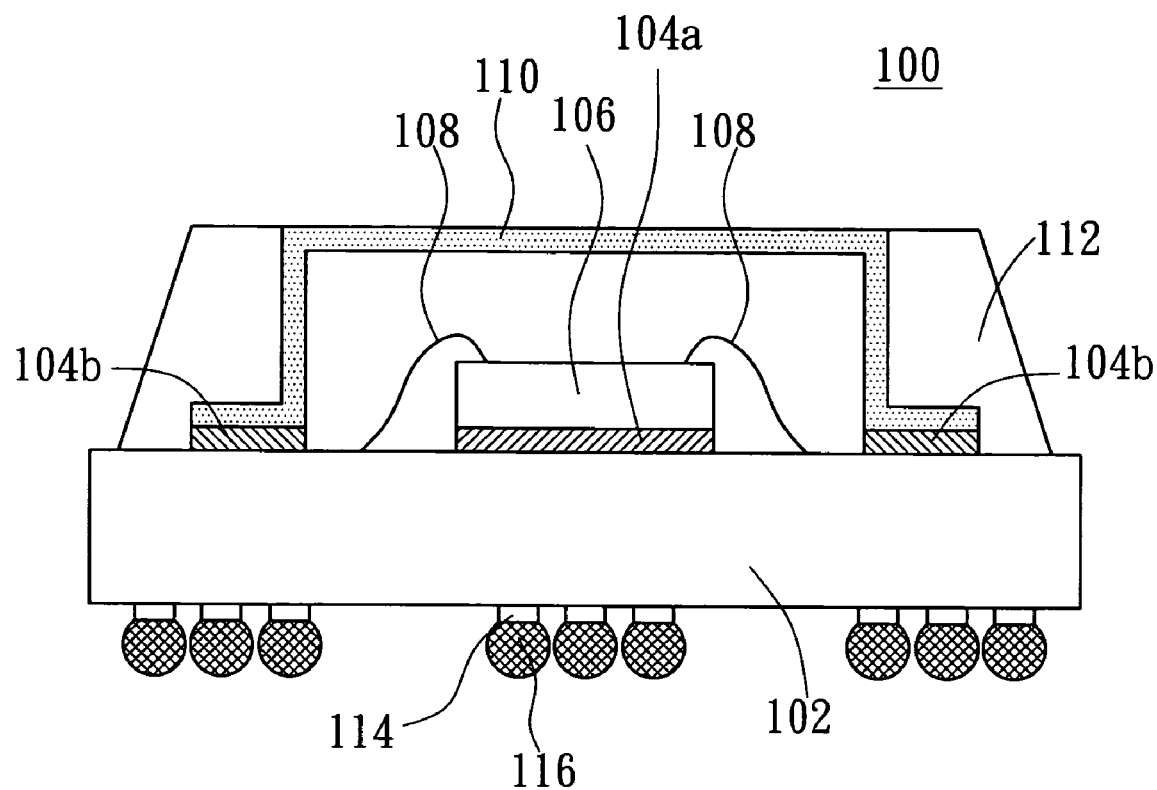
FIG. 1 is a cross-sectional view showing a conventional package having a metal heat slug ball grid array (HSBGA).
Figure 2A:
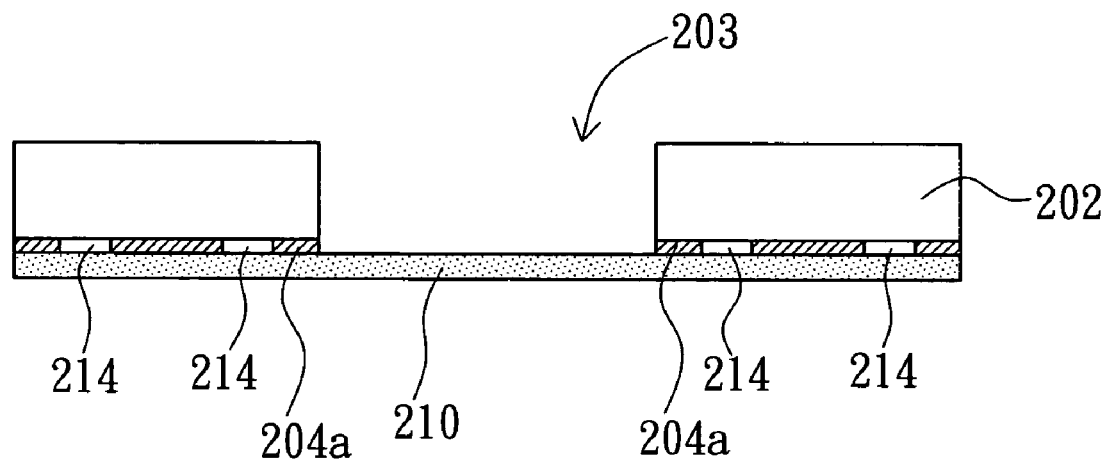
FIGS. 2A to 2E are cross-sectional views showing steps for manufacturing a package according to a first embodiment of the invention.

FIGS. 2A to 2E are cross-sectional views showing steps for manufacturing a package according to a first embodiment of the invention. Fist, as shown in FIG. 2A, a substrate 202 having an opening 203 is provided, and a metal slice 210 is disposed on the bottom surface of the substrate 202 to cover the opening 203 and the bond pads 214 on the bottom surface of the substrate 102. The metal slice 210 may be disposed on the bottom surface of the substrate 202 by an adhesive agent 204a.

Figure 2B:
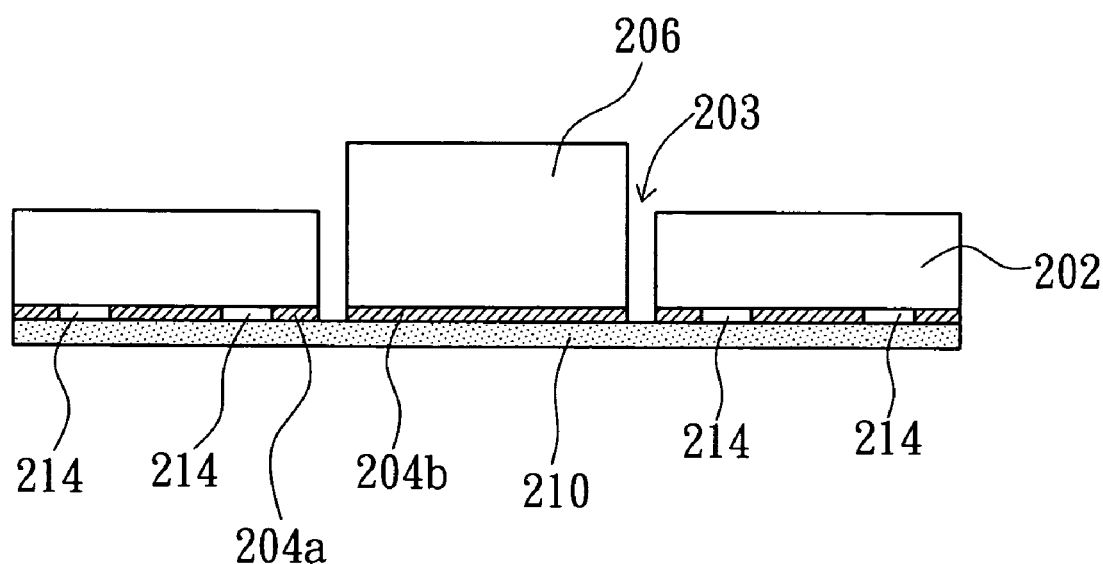

Next, a die attaching process for disposing a die 206 on the metal slice 210 inside the opening 203 is performed, as shown in FIG. 2B. In FIG. 2B, the bottom area of the die 206 is smaller than the dimension of the opening 203, and the die 206 is disposed on the metal slice 210 inside the opening 203 by another adhesive agent 204b. Since the die 206 does not completely filled into the opening 203, a gap is existed between the die 206 inside the opening 203 and the sidewall of the opening 203. Of course, the invention may also utilize an adhesive agent to fill the gap between the die 206 and the sidewall of the opening 203. If the bottom area of the die is equal to the dimension of the opening 203, a die, which may just fits the opening 203, may be disposed on the metal slice 210 inside the opening 203 also by applying an adhesive agent.

Figure 2C:
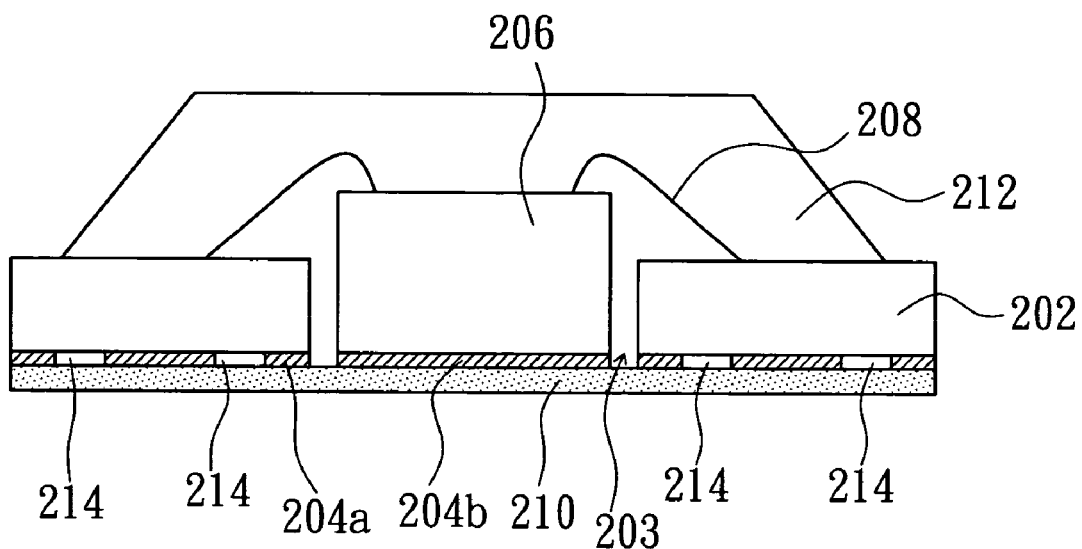

Then, wire bonding and encapsulating processes are sequentially performed to form a number of bond wires 208 and an encapsulating mold compound 212, as shown in FIG. 2C. In FIG. 2C, the bond wires 208 are formed between the top surface of the die 206 and the top surface of the substrate 202 so as to electrically connect the die 206 to the substrate 202. In addition, the encapsulating mold compound 212 covers the die 206, the bond wires 208, and a part of the top surface of the substrate 202. In the embodiment, the bottom area of the die 206 is smaller than the dimension of the opening 203. Thus, the encapsulating mold compound 212 may be filled into the gap between the die 206 and the sidewall of the opening 203.

Figure 2D:
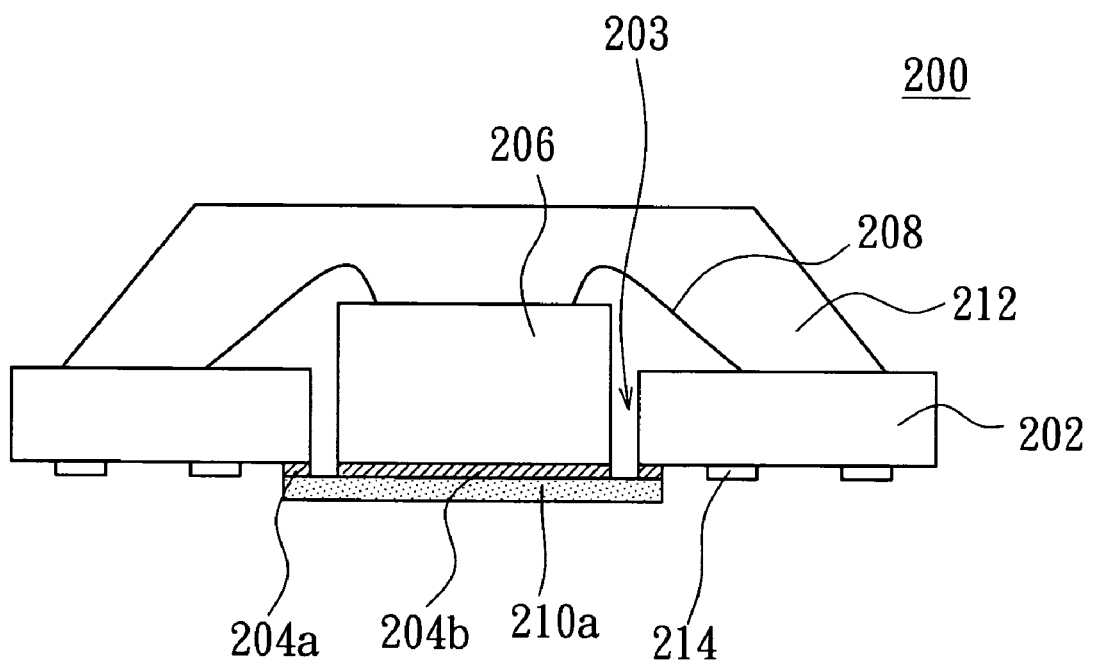
Figure 2E:
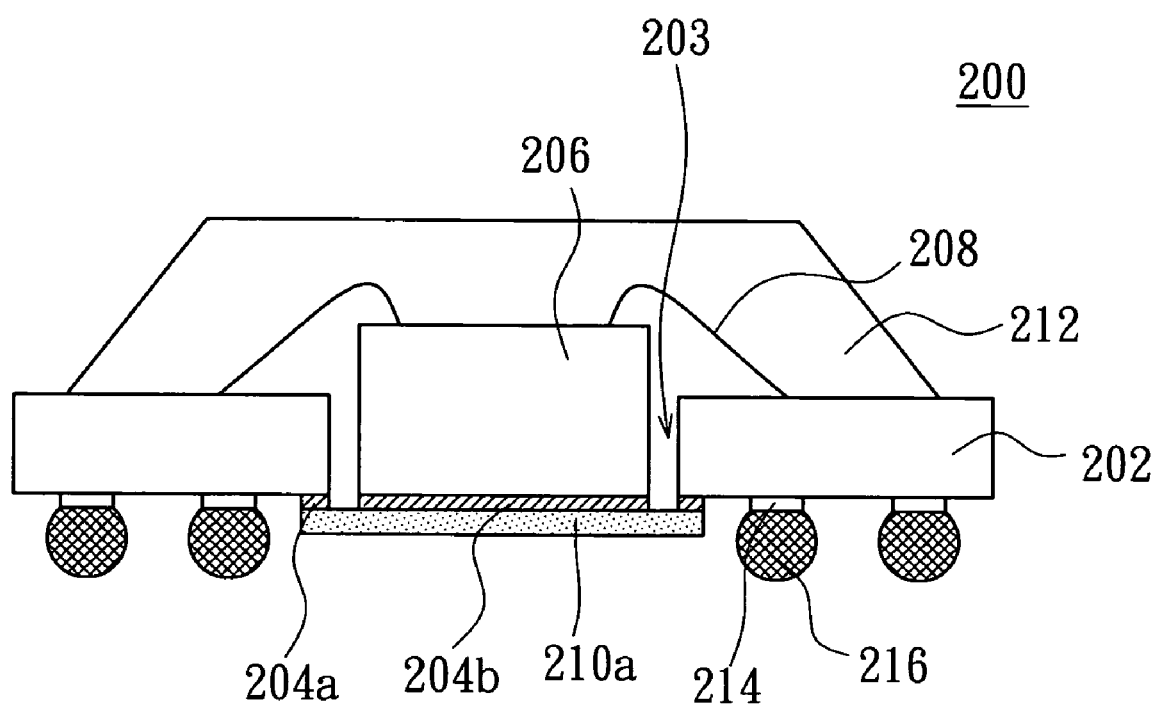

Next, a part of the metal slice 210 is removed to form a metal heat slug 210a, which is thermally connected to the die 206, and to expose the bond pads 214, as shown in FIG. 2D. In FIG. 2D, the metal heat slug 210a is located below the die 206, the metal heat slug 210a is formed by etching a part of the metal slice 210, and the top area of the metal heat slug 210a is greater than the dimension of the opening 203. Then, a ball mounting process is performed to form a number of solder balls 216, which are flush with each other, on the bond pads 214, and the package 200 is thus completed, as shown in FIG. 2E. In FIG. 2E, under the condition that the top end of the metal heat slug 210a and the top ends of the solder balls 216 are positioned at the same horizontal level, the thickness of the metal heat slug 210a is smaller than the height of the solder ball 216. The thickness of the package 200 counts from the bottom end of the solder ball 216 to the top end of the encapsulating mold compound 212.

When the package 200 is operating, the heat generated from the die 206 may be directly dissipated to the outside through the metal heat slug 210a, which has high thermal conductivity and is positioned below the bottom surface of the die 206. Thus, the blocking effects of the solder mask of the substrate 202 with low thermal conductivity may be avoided, and the heat dissipating effect of the package 200 is better than that of the conventional package 100. In addition, because the thickness of the metal heat slug 210a is smaller than the height of the solder ball 216, the design of disposing the die 206 inside the opening 203 and the metal heat slug 210a below the bottom surface of the die 206 may greatly reduce the thickness of the package 200, as compared to the thickness of the conventional package 100. Moreover, the arrangement of the metal heat slug 210a may not conflict with that of the bond wires 208, and the area of the top surface of the substrate 202 may be effectively reduced. Thus, the volume of the package 200 may be greatly reduced.

Figure 3A:
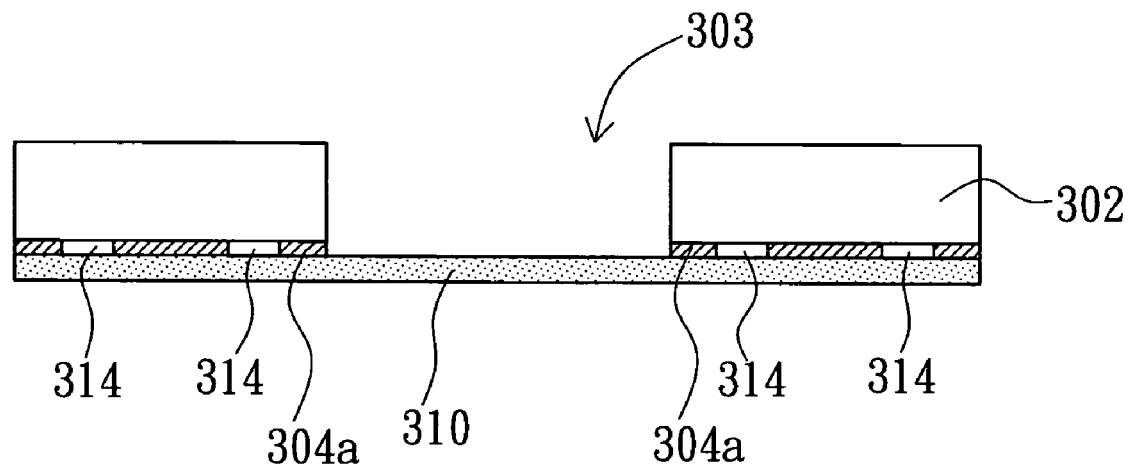
FIGS. 3A to 3E are cross-sectional views showing steps for manufacturing a package according to a second embodiment of the invention.

FIGS. 3A to 3E are cross-sectional views showing steps for manufacturing a package according to a second embodiment of the invention. First, as shown in FIG. 3A, a substrate 302 having an opening 303 is provided, and a metal slice 310 is disposed on the bottom surface of the substrate 302 to cover the opening 303 and the bond pads 314 on the bottom surface of the substrate 302. The metal slice 310 is disposed on the bottom surface of the substrate 302 by an adhesive agent 304a.

Figure 3B:
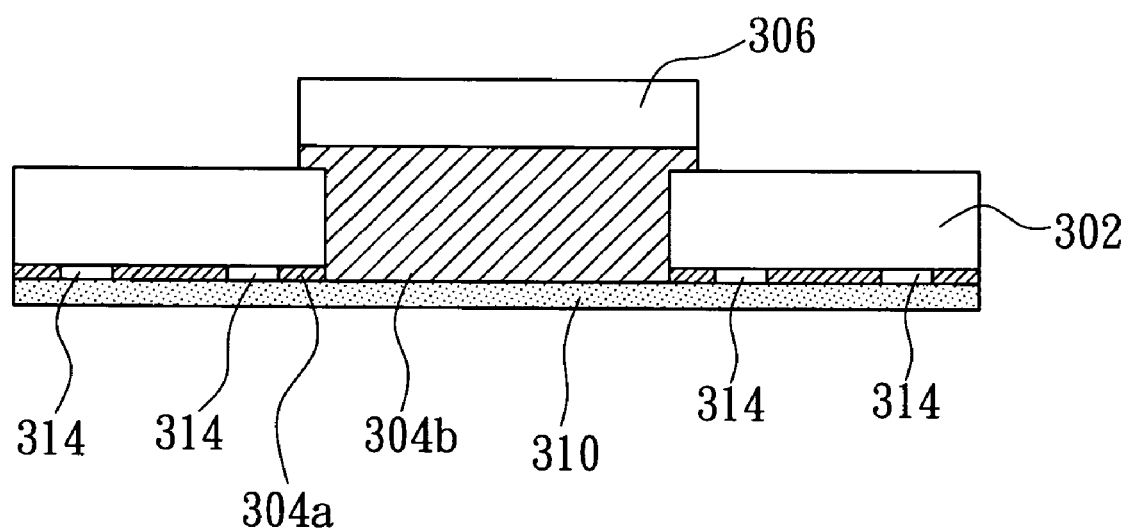

Next, a die attaching process for disposing a die 306 above the top surface of the substrate 302 outside the opening 303, as shown in FIG. 3B. In FIG. 3B, the bottom area of the die 306 is greater than the dimension of the opening 303, and the die 306 is disposed above the top surface of the substrate 302 outside the opening 303 by another adhesive agent 304b. Herein, the opening 303 between the die 306 and the metal slice 310 is filled with the adhesive agent 304b.

Figure 3C:
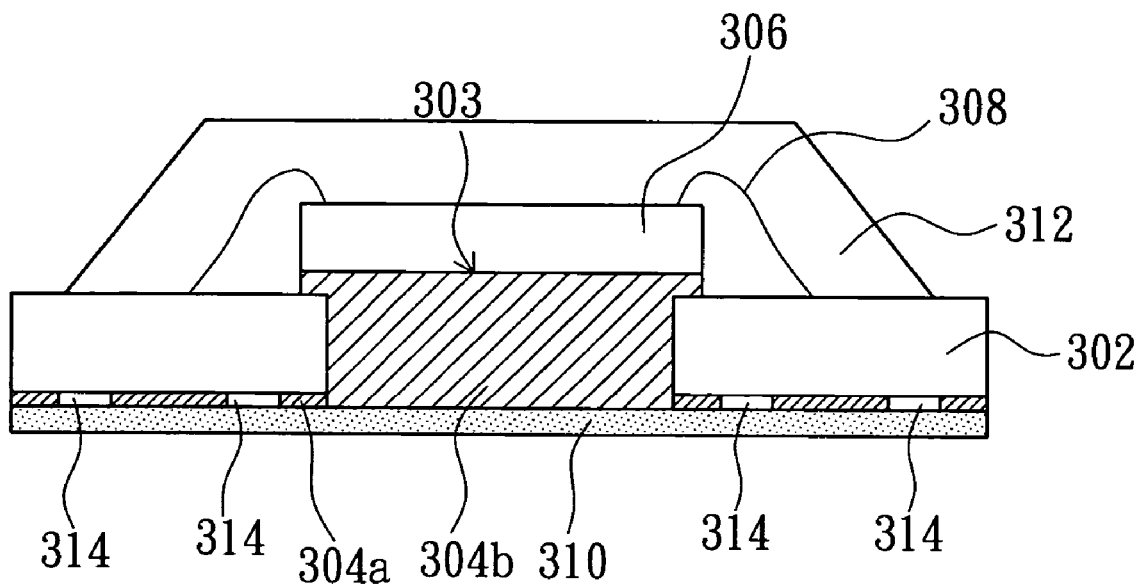

Then, wire bonding and encapsulating processes are sequentially performed to form a number of bond wires 308 and an encapsulating mold compound 312, as shown in FIG. 3C. In FIG. 3C, the bond wires 308 are formed between the top surface of the die 306 and the top surface of the substrate 302 so as to electrically connect the die 306 to the substrate 302. In addition, the encapsulating mold compound 312 covers the die 306, the bond wires 308, and a part of the top surface of the substrate 302.

Figure 3D:
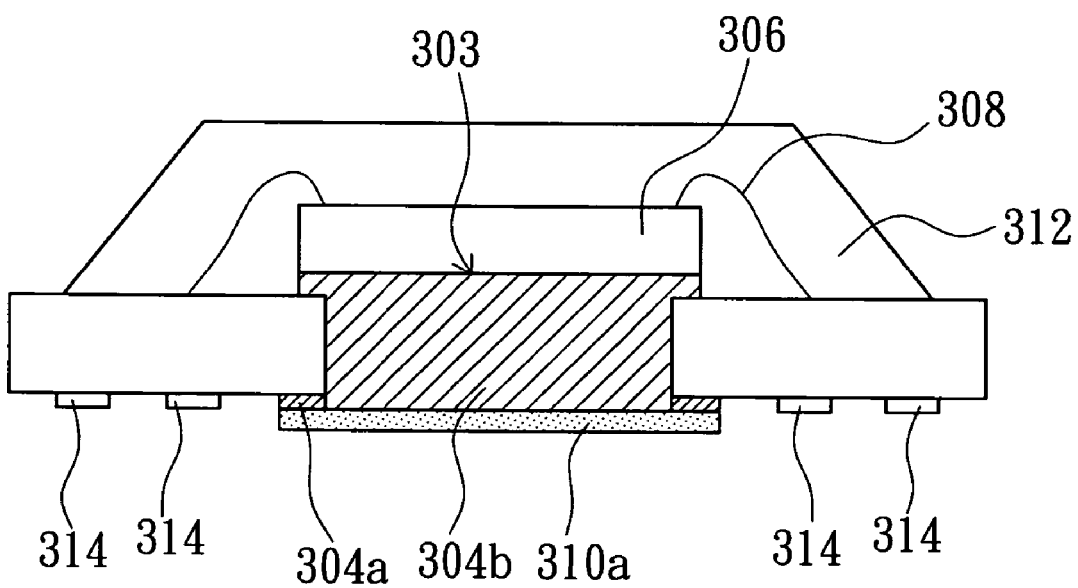
Figure 3E:
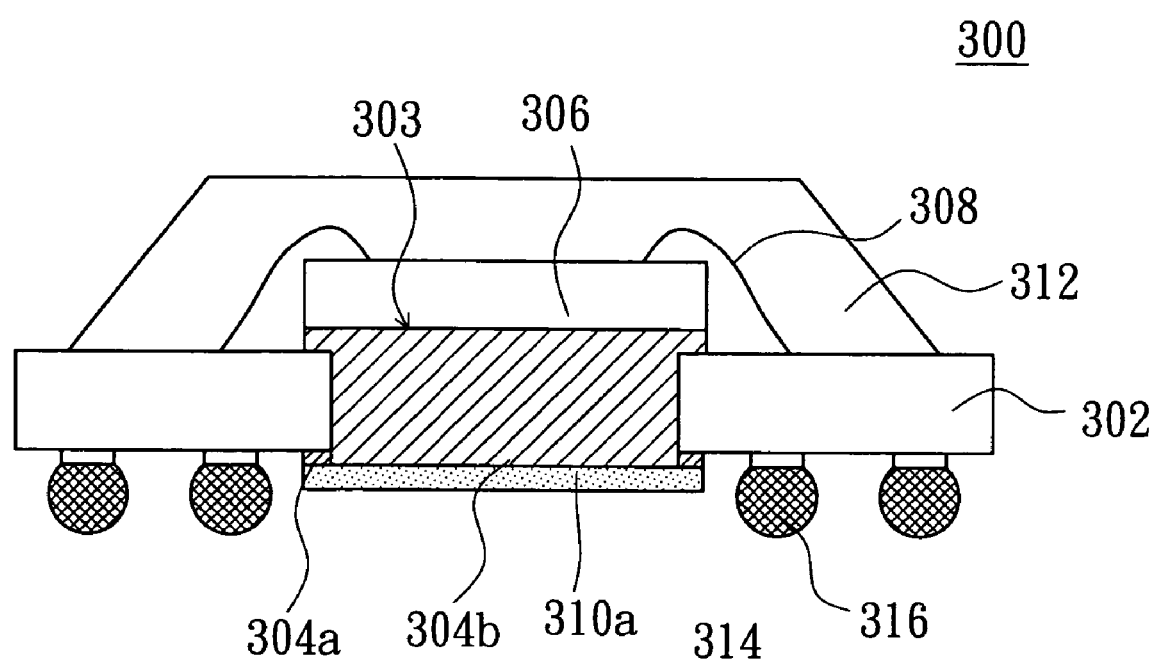

Next, a part of the metal slice 310 is removed to form a metal heat slug 310a, which is thermally connected to the die 306, and to expose the bond pads 314, as shown in FIG. 3D. In FIG. 3D, the die 306 is thermally connected to the metal heat slug 310a through the adhesive agent 304b, the metal heat slug 310a is located below the die 306, the metal heat slug 310a is formed by etching a part of the metal slice 310, and the top area of the metal heat slug 310a is greater than the dimension of the opening 303. Then, a ball mounting process is performed to form a number of solder balls 316, which are flush with each other, on the bond pads 314, and the package 300 is thus completed, as shown in FIG. 3E. In FIG. 3E, under the condition that the top end of the metal heat slug 310a and the top ends of the solder balls 316 are positioned at the same horizontal level, the thickness of the metal heat slug 310a is smaller than the height of the solder ball 316, and the thickness of the package 300 counts from the bottom end of the solder ball 316 to the top end of the encapsulating mold compound 312.

When the package 300 is operating, the heat generated from the die 306 may be directly dissipated to the outside through the metal heat slug 310a, which has high thermal conductivity and is positioned below the bottom surface of the die 306. Thus, the blocking effects of the solder mask of the substrate 302 with low thermal conductivity may be avoided, and the heat dissipating effect of the package 300 is better than that of the conventional package 100. In addition, because the thickness of the metal heat slug 310a is smaller than the height of the solder ball 316, the design of disposing the metal heat slug 310a below the bottom surface of the die 306 may greatly reduce the thickness of the package 300 as compared to the thickness of the conventional package 100. Moreover, the arrangement of the metal heat slug 310a may not conflict with that of the bond wires 308, and the area of the top surface of the substrate 302 may be effectively reduced. Thus, the volume of the package 300 may be greatly reduced.

One of ordinary skill in the art may understand that the technology of the invention is not limited thereto. For instance, the metal slice and the metal heat slug may be made of silver, copper or substances with high thermal conductivity. The opening of the substrate may be formed by way of mechanical drilling, laser drilling or other methods for drilling. In addition, the metal heat slug also may be directly disposed on the bottom surface of the substrate with the metal heat slug just covering the bottom of the opening and not covering the bond pads on the bottom surface of the substrate. Consequently, the steps for disposing the metal slice and removing a part of the metal slice may be omitted in this invention.

In the packages and manufacturing methods thereof according to the embodiments of the invention, the design of disposing a metal heat slug below the bottom surface of the die enable the heat of the die to be dissipated out of the package through the metal heat slug, which is below the bottom surface of the die and has high thermal conductivity. Thus, the blocking effects of the solder mask of the substrate having low thermal conductivity may be avoided, and the heat dissipating effects of the package may be improved. In addition, because the thickness of the metal heat slug is smaller than the height of the solder ball, the thickness of the package may be reduced. Moreover, the arrangement of the metal heat slug may not conflict with that of the bond wires, and the area of the top surface of the substrate may be reduced. Hence, the package volume can be relatively reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a package, comprising steps of:

providing a substrate having an opening and a bottom surface formed with a plurality of bond pads;

disposing a metal slice on the bottom surface of the substrate to cover the opening and the bond pads on the bottom surface of the substrate;

disposing a die on the metal slice inside the opening or above a top surface of the substrate outside the opening;

forming a plurality of bond wires between the top surface of the die and the top surface of the substrate to electrically connect the die to the substrate;

forming an encapsulating mold compound to cover the die, the bond wires, and a part of the top surface of the substrate; and removing a part of the metal slice to form a metal heat slug thermally connected to the die and to expose the bond pads.

2. The method according to claim 1, further comprising a step of forming a plurality of solder balls flush with each other on the bond pads after the step of removing the part of the metal slice.

3. The method according to claim 2, wherein a thickness of the metal heat slug is smaller than a height of each of the solder balls.

4. The method according to claim 1, wherein the step of disposing the metal slice on the bottom surface of the substrate comprises the step of:

using an adhesive agent to dispose the metal slice on the bottom surface of the substrate.

5. The method according to claim 1, wherein the step of disposing the die on the metal slice inside the opening comprises the steps of:

using an adhesive agent to dispose the die, which has a bottom area smaller than a dimension of the opening, on the metal slice inside the opening; and filling another adhesive agent into a gap between the die and a sidewall of the opening.

6. The method according to claim 1, wherein the step of disposing the die on the metal slice inside the opening comprises the steps of:

using an adhesive agent to dispose the die, which has a bottom area equal to a dimension of the opening, on the metal slice inside the opening.

7. The method according to claim 1, wherein the step of disposing the die above the top surface of the substrate outside the opening comprises the steps of:
   using an adhesive agent to dispose the die, which has a bottom area greater than a dimension of the opening, on the top surface of the substrate outside the opening; and
   filling the adhesive agent in the opening between the die and the metal slice.

8. The method according to claim 7, wherein the die is thermally connected to the metal heat slug by the adhesive agent.

9. The method according to claim 1, wherein the metal slice is made of copper.

10. The method according to claim 9, wherein the metal heat slug is made of copper.

11. The method according to claim 1, wherein the step of removing the part of the metal slice comprises the step of:
   etching the metal slice to form a metal heat slug that is thermally connected to the die.

* * * * *